United States Patent [19]

Harman et al.

[11] Patent Number: 5,594,332
[45] Date of Patent: Jan. 14, 1997

[54] ALTERNATING CURRENT DETECTOR

[75] Inventors: R. Keith Harman, Kanata; C. Brian Wong, Kirkland; Gennady Reshetnikov; Brian McLaughlin, both of Ottawa, all of Canada

[73] Assignee: Iris Electronics Corporation, Ottawa, Canada

[21] Appl. No.: 321,802

[22] Filed: Oct. 12, 1994

[51] Int. Cl.⁶ .................................................. G01R 1/20
[52] U.S. Cl. ........................... 324/127; 336/173; 336/225
[58] Field of Search ............................... 324/127, 117 R, 324/96; 340/651; 368/113; 336/173, 225

[56] References Cited

U.S. PATENT DOCUMENTS

| | | | |
|---|---|---|---|
| 3,056,922 | 10/1962 | Du Vall et al. | 368/113 |
| 4,286,213 | 8/1981 | Fowler | 324/127 |
| 4,414,543 | 11/1983 | Schweitzer, Jr. | 340/651 |
| 4,717,872 | 1/1988 | Wagner et al. | 324/127 |
| 4,754,218 | 6/1988 | Wagner et al. | 324/127 |
| 5,053,695 | 10/1991 | Canter | 324/117 R |
| 5,066,903 | 11/1991 | Ochi | 324/96 |
| 5,172,052 | 12/1992 | Wells | 324/117 R |

*Primary Examiner*—Ernest F. Karlsen
*Assistant Examiner*—Russell M. Kobert
*Attorney, Agent, or Firm*—Pascal & Associates

[57] ABSTRACT

A method of sensing alternating current in a cable having at least a pair of longitudinal conductors each of the pair carrying a current equal or unequal in absolute value to the other in mutually opposite directions, is comprised of disposing a coil with its lateral plane adjacent the cable in a position whereby electromagnetic fields caused by the currents intersect primarily different portions of the coil and induce current in the coil, and detecting the induced current in the coil.

20 Claims, 3 Drawing Sheets ns5,594,332

ALTERNATING CURRENT DETECTOR

FIELD OF THE INVENTION

This invention relates to the field of alternating current sensors, and particularly to a sensor for, and a method of sensing alternating current carried by pair of wires carrying equal or unequal currents in opposite directions within a cable, which can be easily and safely installed in a non-invasive manner.

BACKGROUND TO THE INVENTION

Domestic alarm systems have been used to alert for the presence of intruders, smoke, fire, water, etc. However it would be of significant advantage to be able to receive an alert for the presence of the flow of electrical current to an appliance, for example to avoid the possibility of causing a fire by accidentally not shutting off a stove burner or oven. Domestic electrical current is typically carried by wires in a cable. Usually pairs of such wires carry equal current in opposite directions. In the past it was necessary to detect such current by intrusive means, such as by connecting an ammeter or other current detector in series with at least one of the wires, or by isolating one of the wires from the cable and measuring the electromagnetic field surrounding one of the wires by using e.g. a galvanometer or a Hall effect device. It was not possible to measure the electromagnetic field caused by currents carried by both wires without isolating the wires since the currents, traveling in opposite directions establish electromagnetic fields which cancel each other.

Isolating the wires to measure the electromagnetic fields or connecting an ammeter or equivalent circuit to the wires directly can be dangerous to the household do-it-yourselfer, and can be costly if professional service persons are hired to install the detection apparatus.

U.S. Pat. No. 5,250,894 issued Oct. 5, 1994, invented by Ronald P. Bridges et al, describes a system for detecting current carried by plural parallel wires. In this system plural Hall effect devices are disposed at fixed equally spaced positions relative to associated wires. Each Hall effect device detects the electromagnetic field associated with the associated closest wire, as well as the reduced electromagnetic field associated with the more distant two wires. The resulting detected currents associated with the more distant two wires are subtracted from the current output from the detector to result in a net detected current from the closest associated wire. This structure is duplicated for each of the Hall effect devices to provide a combined output signal resulting from all the currents in all of the three spaced wires.

SUMMARY OF THE INVENTION

The present invention provides means for detecting current and the value of current in plural parallel wires such as those contained in a cable which is not invasive to the cable, and in which no particular spacing is required between the sensor which is used and any of the wires. No separation of the wires and no connection to the wires are required. Further, the invention can be used to detect the current and the value of the current carried by a pair of wires in a cable which carry equal current in opposite directions. The wires may be parallel with or without a twist. Only a single sensor need be used.

In the present invention, a sensor which is comprised of a coil is placed with its lateral plane wrapped around part of the cable, and the coil is rotated around the axis of the cable to a position whereby the induced current is maximum. The reason why currents are induced into the coil will be described in more detail later in this specification. The induced current can be measured for two known current levels (values) carried by the wires, and the value of any other current carried by the wires resulting in a measured induced current can be linearly interpolated from the two measurements.

The induced current can be used to provide a logic signal to an alarm, which can be inhibited thereby from being armed. In this manner, for example, a user who may be setting a domestic alarm in anticipation of a trip can be alerted that a domestic appliance such as a stove has not been shut off.

In accordance with an embodiment of the invention, a method of sensing alternating current in a cable having at least a pair of longitudinal conductors each of the pair carrying a current equal or unequal in absolute value to the other in mutually opposite directions, is comprised of disposing a generally flat flexible coil with its lateral plane adjacent the cable in a position whereby electromagnetic fields caused by the currents directly intersect the coil and induce current in the coil, and detecting the induced current in the coil.

In accordance with another embodiment, a current sensing system is comprised of a coil having an air core, apparatus for fixing the coil in the proximity of at least a pair of closely spaced conductors each of which can carry alternating current, the position of the coil relative to said conductors being located such that electromagnetic fields surrounding the conductors resulting from said currents can directly induce current into the coil.

BRIEF DESCRIPTION OF THE DRAWINGS

A better understanding of the invention will be obtained by reading the description of the invention below, with reference to the following drawings, in which.

DETAILED DESCRIPTION OF THE INVENTION

Figure 1:
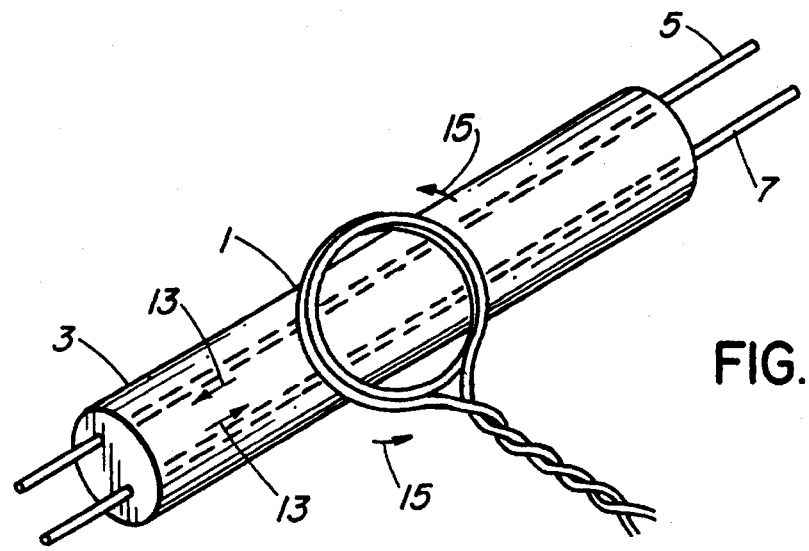
FIG. 1 is a diagram illustrating the sensor in basic form.

FIG. 1 illustrates the invention in basic form. A current sensor is comprised of a coil of one or more turns of wire. The lateral plane of the coil is first located tangent to the outside surface of a cable 3 containing at least a pair of conductors (wires) 5 and 7.

Figure 2A:
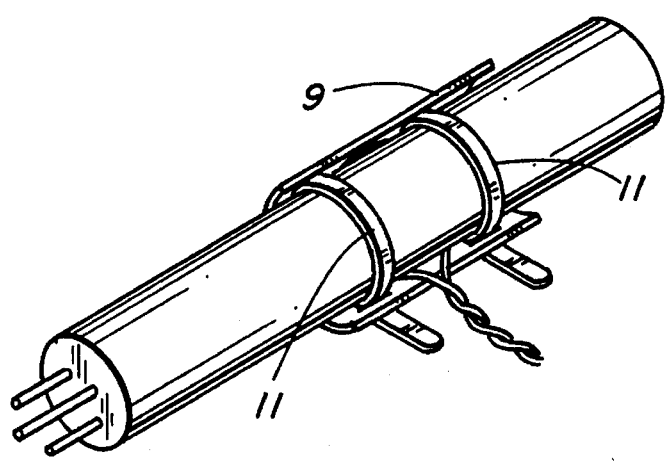
FIGS. 2A and 2B illustrate the sensor in position in back of a cable and in front of the cable, respectively, and FIGS. 3A and 3B, placed together as shown in FIG. 3C, form a schematic diagram of a circuit for detecting induced current in the sensor.
Figure 2B:
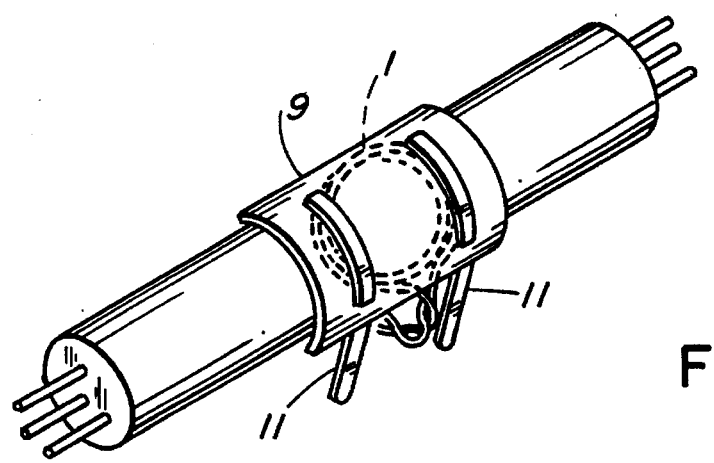

Preferably the coil is supported on and protected by a pliable or soft insulating and non-screening base 9, as shown in FIGS. 2A and 2B. The coil can be laminated between sheets of pliable material such as a bendable plastics material. The base should be fitted with means to hold the coil wrapped against the cable such as with tie-wrap cable ties 11.

With reference to FIGS. 1, 2A and 2B, opposite direction current carried by the wires 5 and 7 is illustrated by the arrows 13, and current induced in the coil 1 from electromagnetic fields surrounding the wires is illustrated by the arrows 15.

Since the coil 1 is wrapped around the outside of the cable, parts of the coil, as they rest on the outside surface of the cable, are in some places closer to one particular conductor than to the other. The electromagnetic fields of the two currents 13 are opposite in polarity to each other. Since the wire of one side of the coil leads in the direction opposite to the wire of the other side of the coil, the electromagnetic fields of the opposite currents 13 reinforce each other, rather than cancel.

This result is based on the dimensions of the coil relative to the spacing of the wires in the cable. The maximum width of the coil in the direction of the spacing of the wires 5 and 7 can be any dimension as long as it does not wrap around the cable completely (in order to avoid cancellation of the induced currents). Thus the maximum width of the coil should be less than pi times the outside spacing of the wires (or more practically, times the outside diameter of the cable). Preferably the coil width should be no more than 300% of the diameter of the cable. A theoretical maximum sensitivity of the sensor was calculated with the coil width about 155% of the diameter of the cable.

The minimum width of the coil is preferred to be about 50% of the width of the cable.

The length of the coil is not critical, but sensitivity is increased with the coil elongated in the axial direction of the cable, subject to its dimension in the axial direction of the cable not exceeding the length of the cable over a 180 degree twist length thereof, in the case in which the wires are twisted.

In the case of twisted wires in the cable, the rotation of the axis between the two wires within the cable is self aligning to the coil 1, since the coil is substantially circular or oval.

The coil should preferably be formed of thin wire, for example AWG 28, so that the number of turns can be increased without making the bulk of the coil so physically large that it cannot be wrapped around the cable or so that turns of the coil are so far from the wires 5 and 7 so that they have little current induced therefrom. The sensitivity of the coil is increased with the number of turns of wire of which it is made.

The coil is placed into position and wrapped around the cable, tied sufficiently loosely by the cable ties so as to allow the coil to be rotated around the axis of the cable. With the wires 5 and 7 carrying current, induced current in the coil 1 is detected using a microameter or another current detecting circuit. The coil is rotated around the axis of the cable, while the induced current is monitored. A position of maximum induced current will be detected. At that point the cable ties 11 are tightened and the coil is left in fixed position relative to the cable.

To calibrate the sensor, a known alternating current is carried by the wires 5 and 7. This can be obtained by measuring the load resistance of a stove element connected to the wires 5 and 7 and knowing the mains voltage, e.g. 117 Volts, calculating the current using Ohms law. The load resistance of another stove element having a different power rating is measured and a similar calculation is performed.

Each of the elements is then separately and individually turned on "high", and the induced current in coil 1 measured using, e.g. a microameter. Thus two induced current values for two current levels carried by the wires 5 and 7 can be determined. The sensor induced current values are linearly proportional to the current carried by the wires 5 and 7, and therefore any induced current value can be linearly interpolated to the magnitude of current carried by the wires 5 and 7.

The invention is not restricted for use with only two wires carrying equal current in opposite directions. The cable can carry more than two conductors, and the current carried by any pair of wires can be measured, as long as each wire of the pair is not exactly equidistant to two halves of the coil. As long as one wire of the pair is closer to one half of the coil, a current measurement can be made.

For example, a cable which carries current to an oven and range combination typically is comprised of three wires. Power is provided at 117 V. between two of the wires and a ground wire, in different phases to each of a pair of range elements which form resistance loads. Power at 220 V. is provided between the two wires to the oven which forms a resistance load. Thus each range element draws current from one of the phases and the return current flows through the ground wire.

In this example, during installation of the sensor to the cable, the oven is turned on and the range elements are turned off, and the sensor coil is rotated, the induced current measured, and the coil is fixed in position. This aligns the coil halves to the two wires for the two different phases. That is, one half of the coil is essentially tuned to a position of maximum magnetic field difference when the current flows from one of the power phases to the other. At the same time, the other half of the coil is positioned to receive the maximum opposite field relative to the first half.

Figure 3A:
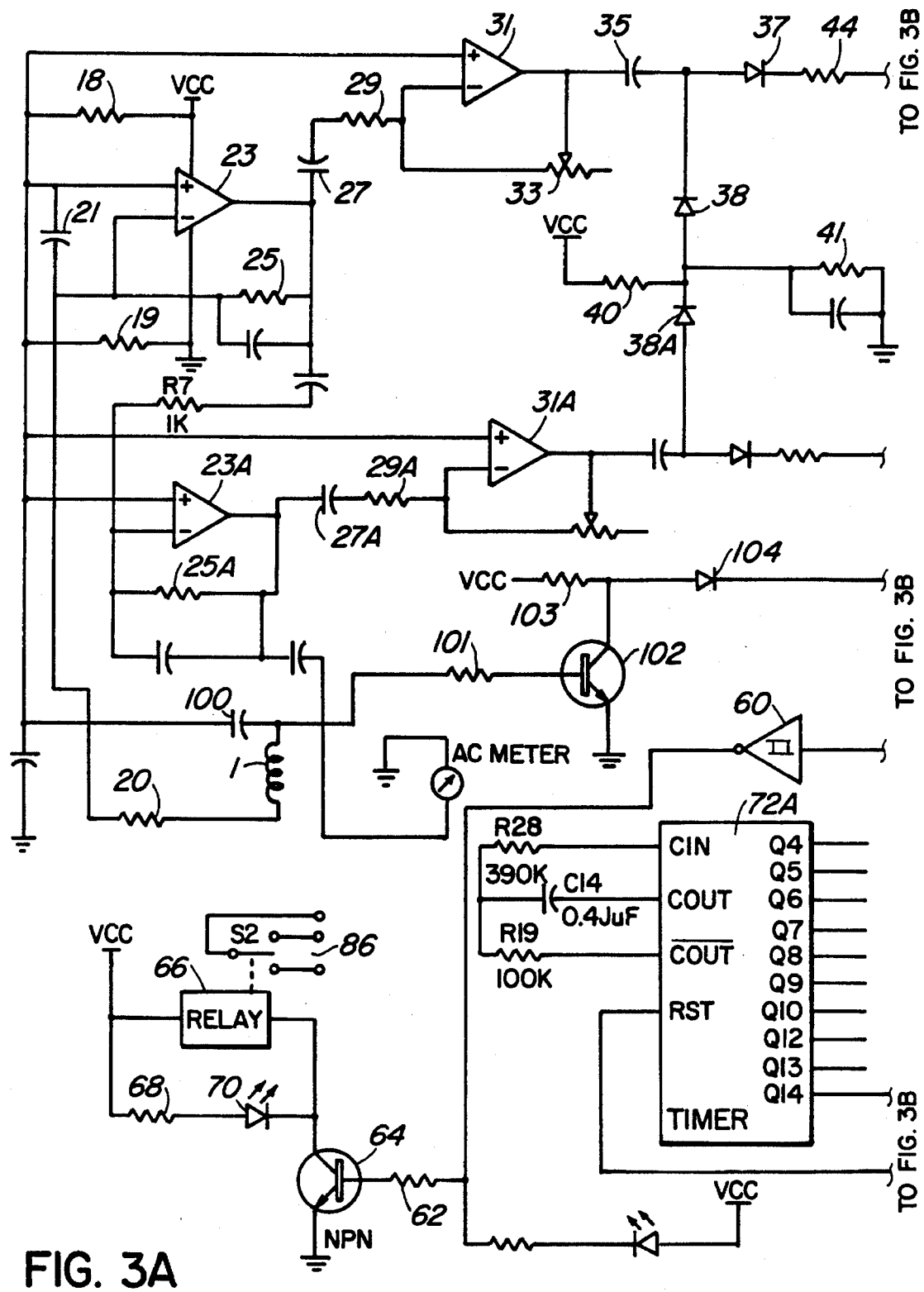
Figure 3B:
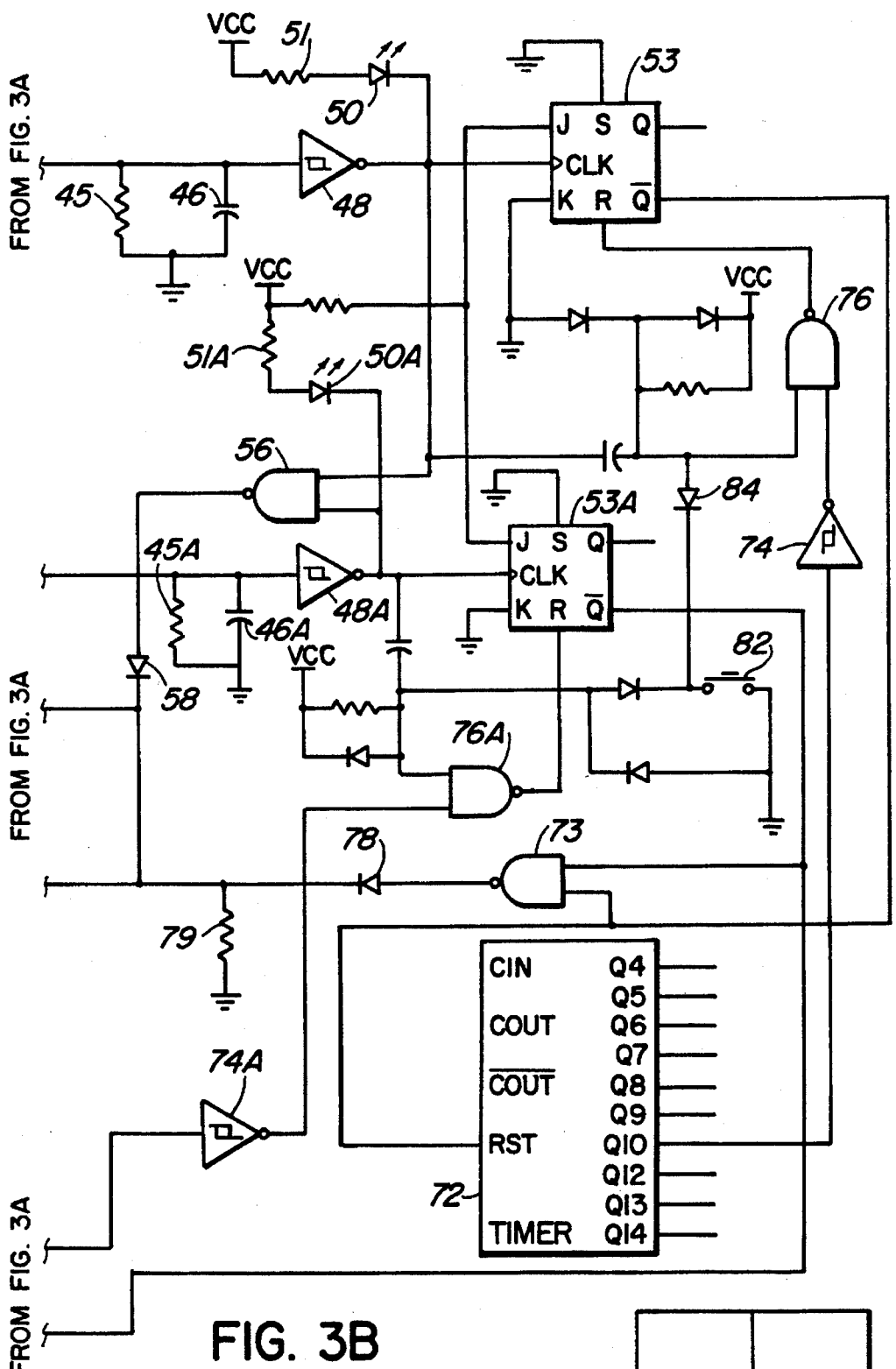
Figure 3C:
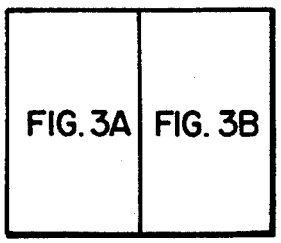

A circuit for detecting the induced current in the coil 1 is illustrated in FIGS. 3A and 3B, which are placed together as shown in FIG. 3C to form a complete schematic diagram.

DC bias for each of the operational amplifiers is provided from the junction of resistors 18 and 19 forming a series connected voltage divider between a voltage rail Vcc and ground. The DC bias is applied to the non-inverting input of each of the operational amplifiers used in this embodiment of the invention.

Induced current from coil 1 is passed through a filter formed of resistor 20 and capacitor 21, which have values to maximize spectral response at the expected current frequencies, e.g. 50 Hz or 60 Hz carried by the cable. Operational amplifier has its inputs connected across capacitor 21, and is configured to provide a virtual ground. The operational amplifier thus effectively absorbs all of the current induced in the coil. The operational amplifier has a resistor 25 connected between its output and its inverting input, and thus converts the absorbed current to a proportional voltage across resistor 25.

This voltage is passed via capacitor 27 and resistor 29 to the inverting input of operational amplifier 31, which has variable resistor 33 connected between its output and its inverting input. Variation in the resistance of resistor 33 adjusts the gain of amplifier 31. The output of the amplifier 31 drives a rectifier through capacitor 35, the rectifier being formed of diodes 37 and 38.

The anode of diode 38 is connected to a positive voltage source provided by Vcc divided through resistor 40 and resistor 41 (bypassed by capacitor 42) connected to ground. This compensates for the diode forward voltage drop from the rectifier.

A DC voltage proportional to the AC voltage input to the rectifier is provided at the cathode of diode 37. This is filtered by series resistor 44 and the parallel circuit of resistor 45 and capacitor 46 to reduce any 60 Hz (or 50 HZ) component from the DC voltage. Preferably this filter decays with a time constant of about one second, to prevent the filter from acting as a peak detector.

The DC voltage is applied to a Schmitt trigger 48, which should have a predetermined DC trigger level. The use of the Schmitt trigger prevents multiple triggering by residual 60 Hz modulating the DC voltage applied thereto.

The output of the Schmitt trigger 48 is applied to a light emitting diode (LED) 50, which is connected to Vcc through a resistor 51, and to the CLK input of flip flop 53. The LED indicates that the threshold level of the Schmitt trigger has been reached.

The output of the Shmitt trigger is also applied through AND gate 56, diode 58, Schmitt trigger 60 and resistor 62 to the base of NPN transistor 64, which has its emitter connected to ground. The collector of transistor 64 is connected to one terminal of the coil of a relay 66, the other terminal of the relay 66 being connected to Vcc. Resistor 68 and indicator LED 70 are connected across the coil of relay 66 to indicate operation of the relay.

It should be noted that since the gain of operational amplifier 31, and thus the DC voltage level, is set by variable resistor 33, the operation of the LED 70, indicating the presence of a logic signal signifying that Schmitt trigger 48 has operated and therefore that the relay has operated, allows setting of the threshold of operation of the circuit by the adjustment of variable resistor 33.

The /Q output of the flip flop 53 is connected to the input of a timer 72 as well as to one input of NAND gate 73. The output of NAND gate is connected through diode 78 (bypassed at its output by bias resistor 79) to the input of Schmitt trigger 60 for operation thereof when flip flop 53 has operated. The flip flop 53 thus provides a toggle to cause relay 66 to be held on even when Schmitt trigger 48 changes its logic output level, caused with the disappearance of DC voltage at its input which is above its operation threshold.

One of the outputs of the timer is connected through Schmitt trigger 74 via NAND gate 76 to the reset input R of the flip flop 53. Thus it may be seen that the logic output of timer 72, when it has timed to a certain predetermined value (e.g. 2 minutes), causes flip flop 53 to reset. This changes the logic level at its /Q output terminal, resulting in release of relay 66.

The purpose of the timer is to provide an indication that current was flowing in the cable being monitored for a time determined by the predetermined time set on the timer. This compensates for the time that a thermostat switches current supply to an oven off during cycling, for example, to maintain its temperature.

It is preferred that a corresponding circuit similar to that described above and operating in a similar manner should be provided (except for duplication of the relay operation circuit). Such a circuit is illustrated with similar elements, those elements being designated by similar reference numerals and an "A" suffix. The purpose of having a duplicate circuit is to provide a second threshold to be set with a separate sensitivity and delay time from that of the already described circuit.

Thus, for example, if a range and oven combination is being monitored, the sensitivity of one setting allows the range to be monitored, and the sensitivity of the second circuit allows the greater current of the oven to be monitored.

A manual reset switch 82 is connected between an input of NAND gate 76 and ground, through diode 84. This allows manual reset of flip flop 53.

Contacts 86 of relay 66 can provide a logic signal to an alarm system, such as a domestic alarm, to inhibit arming it in the presence of current detected in the cable, or during its absence for the timed period during which it may not be present. Thus the alarm could not be set during an interval when an oven thermostat has temporarily shut off current to an oven to maintain its temperature.

Capacitor 100 is connected to the base of transistor 102 through resistor 101 and to the noninverting input of amplifier 23. Transistor 102 has its emitter connected to ground and its collector to voltage $V_{cc}$ through resistor 103. In operation, capacitor 100 discharges through resistor 101 and the base-emitter of transistor 102 if coil 1 is not properly connected. This provides an effective alarm condition at transistor 102 if the coil or its connections fail. With the alarm condition appearing as current flow through transistor 102, current passes through diode 104 which is connected between the collector of transistor 102 and Schmitt trigger 60, causing the relay 66 to operate as described earlier.

The present invention can thus be used for indicating which electrical appliances are on and which are off, by monitoring current in power cables leading to those appliances. It can indicate that electrical appliances such as freezers have failed, by indicating irregular current draw, either in magnitude, or in normal time cycling. It can indicate that a monitored appliance has been left on for too long, by use of the timer.

The invention can be used to measure the amount of current being used, as an ammeter, in a safe, non-invasive manner to the current carrying cable. It can monitor the use of electrical machines, for example laundry machines in Laundromats, such as which machines are used most often, peak periods of use, etc.

The coil as described can be used to monitor voice and data communications on cables such as telephone lines, by modifying the frequency response of the Operational Amplifiers to the appropriate spectrum, e.g. 500 to 2900 Hz region for telephone lines instead of the present 30 to 200 Hz region for power lines, (for peaks at e.g. 50 to 60 Hz) and with the coil sized up or down to the correct dimensions for the target cable. Since telephone communications is carried as current flowing within the telephone cable, the invention is able to use the induced signals in the coil, amplified by the operational amplifiers, to provide an output at the monitor point shown for the AC meter.

A person understanding this invention may now conceive of alternative structures and embodiments or variations of the above. All of those which fall within the scope of the claims appended hereto are considered to be part of the present invention.

We claim:

1. A method of sensing alternating current in a cable having at least a pair of longitudinal conductors, each of the pair carrying a current equal in absolute value to the other in mutually opposite directions, comprising disposing a generally flat flexible coil with its lateral plane adjacent said cable in a position whereby electromagnetic fields caused by said currents directly intersect the coil and induce current in the coil by wrapping the coil with its lateral plane around the cable, detecting the induced current in the coil; moving the coil to maximize the induced current in the coil by rotating the coil around the periphery of the cable, and then fixing the coil to the cable.

2. A method as defined in claim 1 including applying a first known current to one of the conductors, measuring a first induced current in the coil, applying a second known current to said one of the conductors which current is a different value than that of the first known current, measuring a second induced current in the coil, measuring a third unknown induced current in the coil resulting from a third unknown current carried by said one conductor and extrapolating linearly from said first and second induced currents to determine the value of said third unknown current carried by said one conductor.

3. A method as defined in claim 1 including activating a current present indicator means from the detection of the induced current.

4. A method as defined in claim 3 including maintaining the current present indicator means for a predetermined interval following cessation of current carried by said conductors and resulting cessation of detection of induced current.

5. A method as defined in claim 4 in which the current present indicating means includes means for providing a logic signal, providing the logic signal to an alarm system, and inhibiting the arming of the alarm system in the presence of the logic signal.

6. A method as defined in claim 1 in which said at least a pair of longitudinal conductors is comprised of a first wire, a second wire and a ground wire, the first wire and the ground wire carrying first currents, equal in value, at a first voltage, in mutually opposite directions upon connection of a first load therebetween, and the second wire and the ground wire carrying second currents, equal in value, at a second voltage equal in value to said first voltage, in mutually opposite directions upon connection of a second load therebetween, the first voltage being in a different phase to the second voltage, the voltage between the first and second wires being about double that of the first voltage, current passing between the first and second wires upon application of a third load therebetween, the rotating step being taken upon application of only the third load between the first and second wires.

7. A method as defined in claim 1 including operating a current magnitude indicator from the detection of the induced current.

8. A method as defined in claim 1 including detecting at least one of failure in the coil, fault in the coil, and conductive paths to the coil, and activating an alarm in response thereto.

9. A current sensing system comprising a flexible flat coil having an air core, means for fixing the coil in the proximity of at least a pair of closely spaced conductors each of which can carry alternating current, the position of the coil relative to said conductors being located such that electromagnetic fields surrounding both the conductors resulting from said respective currents can directly induce current into the coil.

10. A current sensing system as defined in claim 9, in which the coil has a width in the direction of lateral spacing of the conductors of between about 50% and 300% of the lateral spacing between opposite sides of said conductors, and means for detecting said induced currents.

11. A current sensing system as defined in claim 10 in which the maximum width of the coil is about 250% of the lateral spacing between opposite sides of said conductors.

12. A current sensing system as defined in claim 10 in which the width of the coil is about 155% of the lateral spacing between opposite sides of said conductors.

13. A current sensing system as defined in claim 9 in which said conductors are a twisted pair, the coil having a length in the axial direction of said conductors which does not exceed the length of said conductors over a 180 degree twist thereof.

14. A current sensing system as defined in claim 9 in which the number of conductors is two and are contained in a cable, the means for fixing comprising means for wrapping the coil around part of an outside surface of the cable, for rotating the coil laterally around said outside surface, and for fixing the coil against said outside surface after rotation thereof.

15. A current sensing system as defined in claim 9 in which the coil is elongated in the axial direction of the conductors.

16. A current sensing system as defined in claim 9 in which the detecting means is comprised of an indicator calibrated to provide a display of a current quantity carried by the conductors.

17. A current sensing system as defined in claim 9 in which the detecting means is comprised of a current present indicator having an operation threshold.

18. A current sensing system as defined in claim 17 in which the current present indicator is comprised of means for providing a logic signal for use by an external system when the operation threshold is exceeded.

19. A current sensing system as defined in claim 17 in which the means for providing a logic signal includes a timing means for maintaining the logic signal during a predetermined period following cessation of said induced current.

20. A current sensing system as defined in claim 9 including means for detecting at least one of a failure in the coil, fault in the coil, and conductive paths to the coil, and for actuating an alarm in response thereto.

* * * * *